United States Patent
Chen et al.

(10) Patent No.: US 12,158,707 B2
(45) Date of Patent: Dec. 3, 2024

(54) METHODS AND SYSTEMS FOR REDUCING PARTICULATE DEPOSITION ON PHOTOMASK

(71) Applicant: Taiwan Semiconductor Manufacturing Company, Ltd., Hsinchu (TW)

(72) Inventors: Jui-Chieh Chen, Hsinchu (TW); Yi-Wei Lee, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/199,730

(22) Filed: May 19, 2023

(65) Prior Publication Data
US 2023/0288820 A1    Sep. 14, 2023

Related U.S. Application Data

(62) Division of application No. 17/360,440, filed on Jun. 28, 2021, now Pat. No. 11,693,325.

(60) Provisional application No. 63/172,793, filed on Apr. 9, 2021.

(51) Int. Cl.
*G03F 7/00*    (2006.01)
(52) U.S. Cl.
CPC ...... *G03F 7/70875* (2013.01); *G03F 7/70033* (2013.01)

(58) Field of Classification Search
CPC ............. G03F 7/70875; G03F 7/70033; G03F 7/70858; G03F 7/70916; G03F 7/70908
See application file for complete search history.

(56) References Cited

U.S. PATENT DOCUMENTS

| | | | | |
|---|---|---|---|---|
| 7,812,329 B2 * | 10/2010 | Bykanov | ................ | H05G 2/003 250/493.1 |
| 8,216,386 B2 * | 7/2012 | Mochizuki | ........ | H01L 21/67017 134/21 |
| 11,054,756 B2 * | 7/2021 | Lin | ........................ | G03F 7/7085 |
| 2019/0155178 A1 | 5/2019 | Lin et al. | | |

FOREIGN PATENT DOCUMENTS

CN    111971623 A    11/2020

OTHER PUBLICATIONS

Taiwan Office Action of Application No. 11320914570, Dated Sep. 9, 2024.

* cited by examiner

*Primary Examiner* — Hung V Nguyen
(74) *Attorney, Agent, or Firm* — Lippes Mathias LLP

(57) ABSTRACT

Particulate deposition rate on a photolithographic mask, particularly of tin (Sn) particles produced within an EUV light source, is reduced by producing turbulence within a radiation source chamber of the EUV light source. Turbulence can be produced by changing the temperature, pressure, and/or gas flow rate within the radiation source chamber. The turbulence reduces the number of particles exiting the EUV light source which could be deposited on the photomask.

20 Claims, 5 Drawing Sheets

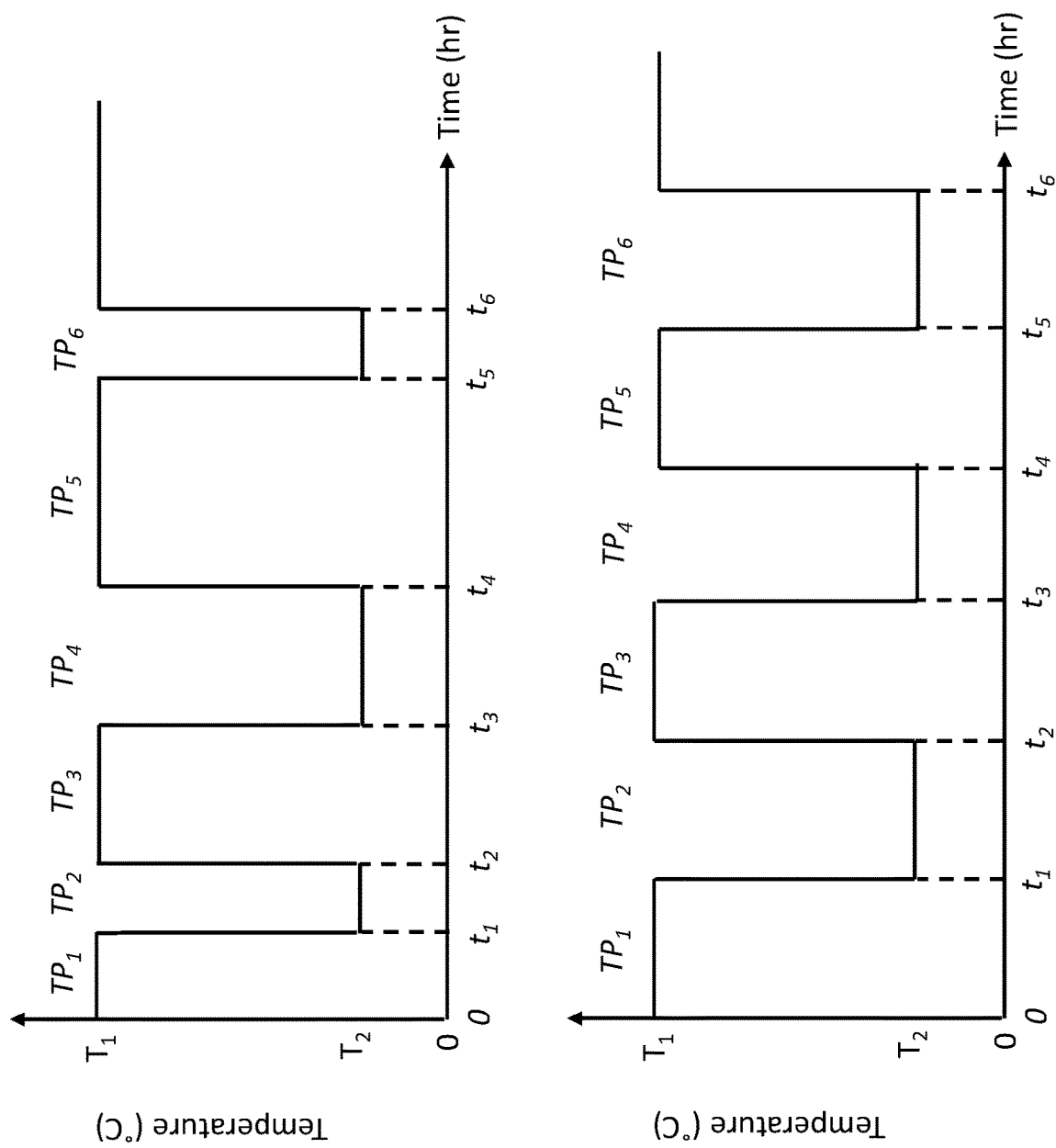

METHODS AND SYSTEMS FOR REDUCING PARTICULATE DEPOSITION ON PHOTOMASK

PRIORITY CLAIM AND CROSS-REFERENCE

This application is a division of U.S. patent application Ser. No. 17/360,440, filed Jun. 28, 2021, now U.S. Pat. No. 11,693,325, which claims the benefit of U.S. Provisional Patent Application Ser. No. 63/172,956, filed Apr. 9, 2021, which is incorporated herein by reference in its entirety.

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The minimum feature size of the pattern is limited by the light wavelength. Deep ultraviolet (UV) lithography uses a wavelength of 193 nm or 248 nm. Extreme ultraviolet (EUV) light, which spans wavelengths from 124 nanometers (nm) down to 10 nm, is currently being used to provide small minimum feature sizes. At such short wavelengths, particle contaminants on the photomask can cause defects in the transferred pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A is an illustrative graph showing an environmental parameter changing over irregular time periods, in accordance with some embodiments.

FIG. 3B is an illustrative graph showing an environmental parameter changing over regular time periods, in accordance with some embodiments.

DETAILED DESCRIPTION

Figure 1:
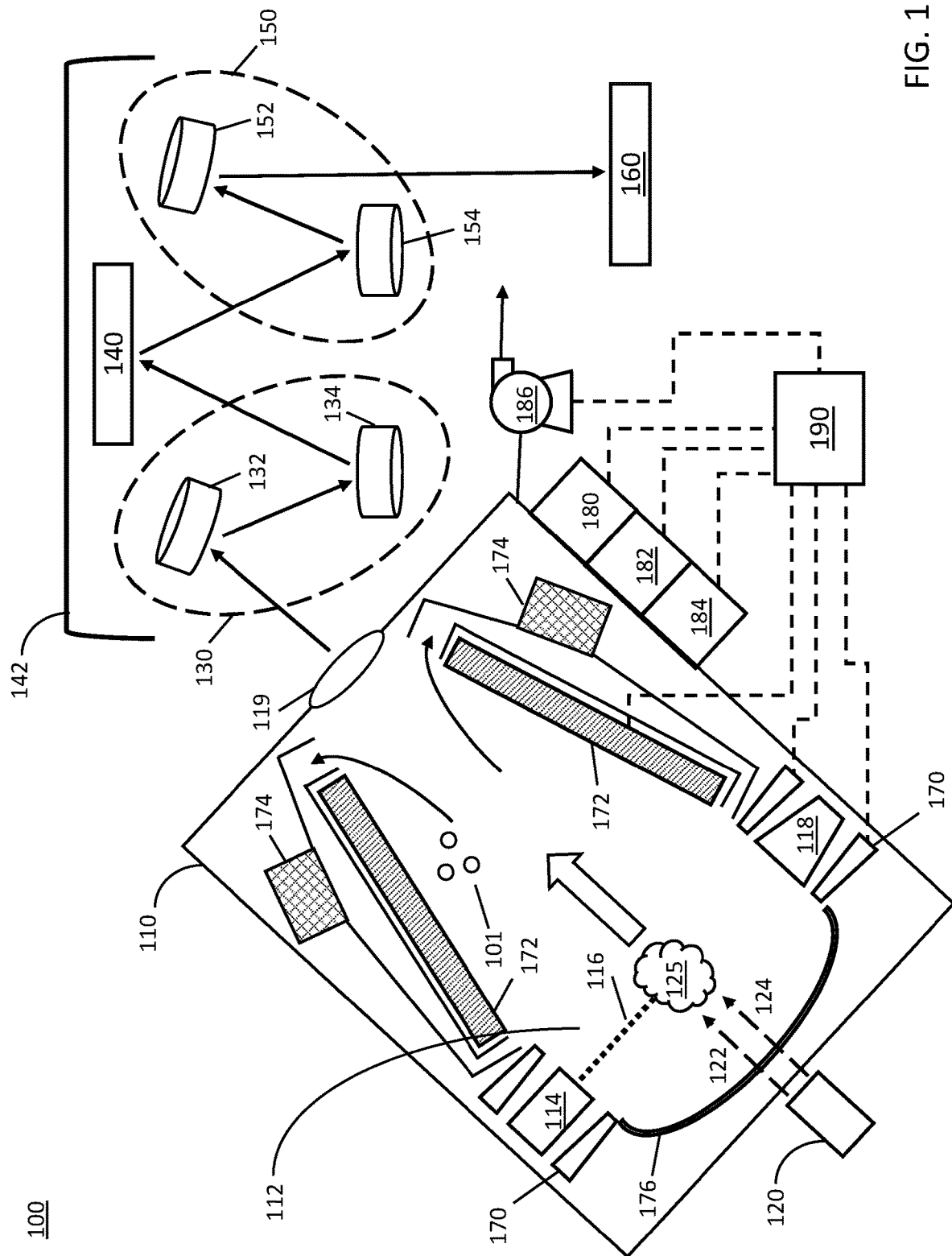
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure may refer to temperatures for certain method steps. It is noted that these references are to the temperature at which the heat source is set, and do not specifically refer to the temperature which must be attained by a particular material being exposed to the heat.

In the present disclosure, the terms "photolithographic mask", "mask", "photomask", and "reticle" are used interchangeably.

In the present disclosure, the terms "particulate", "residual particles", and "residual debris" are used interchangeably.

The term "optic" is used herein to refer broadly to components which reflect and/or transmit and/or operate on incident light, such as mirrors, lenses, windows, filters, or reflectors. Such components can operate at different wavelengths from each other.

The term "turbulence" or "turbulent" is used herein to refer to unsteady or chaotic particle motion, in contrast to laminar flow or Brownian motion.

The present disclosure is generally related to extreme ultraviolet (EUV) lithography systems and methods. The EUV lithography process employs light in the extreme ultraviolet (EUV) region, having a wavelength of about 1 nm to about 100 nm. One type of EUV light source is laser-produced plasma (LPP). LPP technology produces EUV light by focusing a high-power laser beam onto small target droplets to form highly ionized plasma that emits EUV radiation with a peak maximum emission at about 13.5 nm. The EUV light is then collected by a collector mirror and reflected by optics towards a photolithographic mask and then towards a lithography target, e.g., a wafer.

More particularly, the present disclosure is related to systems and methods for mitigating tin (Sn) deposition on an EUV photolithographic mask which can result from a laser produced plasma (LPP) EUV radiation source. In this regard, at short wavelengths, particle contaminants on the photomask can cause defects in the transferred pattern. Sometimes, a pellicle mounted over the photomask can be used to protect the photomask from contaminating particles. Any contaminating particles which land on the pellicle membrane are kept out of the focal plane of the photomask, thus reducing or preventing defects in the transferred pattern caused by the contaminating particles. However, for EUV applications, it may be desirable to eliminate the pellicle to reduce EUV absorption. It would thus be desirable to reduce contaminant particle levels overall. In this regard, the tin (Sn) particles used to generate EUV light can escape from the radiation source chamber of the EUV light source and enter the process chamber containing the photomask itself.

Generally, then particulates that fall onto or are deposited upon the mask, such as tin (Sn) particles, can easily damage the mask pattern and result in heavy yield loss. A high particulate fall-on or deposition rate will require mask repair and cause production line instability (i.e. downtime). Accordingly, the present disclosure desires to reduce the particulate fall-on deposition rate on the mask, by reducing the level of particulates (such as tin particles) which coming from the EUV light source and the radiation source chamber thereof.

FIG. 1 is a schematic diagram, not drawn to scale, illustrating the various components of an EUV lithography system 100. Generally, the EUV lithography system includes an EUV light source 110 that generates EUV light and a laser source 120. Downstream of the EUV light source is an illumination stage 130, which collects and focuses the EUV light on the photomask 140. Downstream of the photomask 140 is the projection optics module 150, which is configured for imaging the pattern of the photomask onto a substrate 160, such as a semiconductor wafer. The lithography system can include other modules or be integrated with or coupled to other modules.

The EUV light source 110 itself includes a radiation source chamber 112 which encloses the plasma reaction that creates EUV light. The radiation source chamber includes a target droplet generator 114. The target droplet generator deposits a plurality of target droplets 116 into the radiation source chamber. In some embodiments, the target droplets are tin (Sn) droplets. In some embodiments the target droplets are made of tin (Sn). In other embodiments, the target droplets may include alternative types of material, for example, a tin-containing liquid material such as eutectic alloy containing tin or lithium (Li). The tin droplets may be deposited at a rate, for example of about 50 thousand droplets per second.

A laser source 120 is also present, which emits one or more laser beams into the radiation source chamber that contact the target droplets to produce EUV light. In some embodiments, the laser source may be a carbon dioxide ($CO_2$) or a neodymium-doped yttrium aluminum garnet (Nd:YAG) laser source, The laser source can be a multi-stage laser having a plurality of stages configured to amplify laser light produced by a prior stage. In some embodiments, the laser source can produce multiple beams. For example, as illustrated here, a pre-heat laser pulse 122 can be used to create a low-density target plume, which is subsequently heated (or reheated) by a main laser pulse 124 that generates EUV light. The laser source generally also includes optics and other focal components for directing the laser beams in a desired direction.

The radiation source chamber 112 includes windows or lenses, which are substantially transparent to the laser wavelength. The generation of the laser beams is synchronized with the target droplets. The pre-heat laser pulse 122 heats the target droplets and expands them into lower-density target plumes. A delay between the pre-pulse 122 and the main pulse 124 is controlled to allow the target plume to form and to expand to an optimal size and geometry. When the main pulse 124 heats the target plume, a high-temperature plasma field 125 is generated. The plasma emits EUV radiation in all directions. The EUV light travelling in the wrong direction (i.e. away from the output port) is collected by a collector mirror 176.

The collector mirror 176 has a reflective surface that reflects and focuses EUV light. In some embodiments, the collector mirror has an ellipsoidal shape. The collector mirror may be coated with materials similar to that of the photomask for reflecting EUV light. EUV light is then directed towards an output port 119, through which the EUV light exits the EUV light source to enter the rest of the lithography system.

A droplet catcher 118 may be installed opposite the target droplet generator 114. The droplet catcher is used to catch excess target droplets.

In the EUV light source, the plasma caused by the laser application creates EUV light and also physical debris, such as ions, gases and atoms of the droplet. To prevent the accumulation of particulate and debris on the collector mirror 176, a buffer gas can be injected along the surface of the collector mirror via gas ports 170. The buffer gas can be $H_2$, He, Ar, $N_2$, or some other inert gas, but is usually hydrogen. Hydrogen gas has a low EUV absorption profile. Hydrogen will react with metals to form a metal hydride. In particular, hydrogen will react with tin to form $SnH_4$ as a gaseous product at the temperatures of the EUV generation process, which can be captured and pumped out. The gaseous $SnH_4$ is then pumped out of the radiation source chamber.

Other debris collection mechanisms may also be present. For example, to further trap residual tin particles and other debris, the interior of the radiation source chamber may include a plurality of vanes 172 disposed around a frusto-conical support frame which narrows in diameter from the plasma field to the output port. The vanes extend generally radially inwards from the support frame. The vanes may be made, for example, from molybdenum or stainless steel. The temperature of the vanes may be controlled to keep tin in a liquid state but not a gaseous state, or in other words above about 231° C. but below about 1,100° C. (at the operating pressure of the EUV light source). For example, the vanes may include channels through which a liquid or gas can be flowed. The liquid or gas may be heated or cooled, as appropriate, to obtain a desired temperature for the vanes. The vanes may also be shaped to direct the liquid tin to an appropriate drain, for example via capillary action and/or wicking action.

Because gas molecules absorb EUV light, the radiation source chamber is typically maintained at vacuum or a low-pressure environment to avoid EUV intensity loss.

Continuing, in the illumination stage 130, the EUV light may be collected and focused as a beam, for example using field facet mirror 132 that splits the beam into a plurality of light channels. These light channels can then directed using one or more relay mirrors 134 onto the plane of the photomask.

The projection optics module 150 may include refractive optics or reflective optics for carrying the image of the pattern defined by the photomask. Illustrative mirrors 152, 154 are shown. The pattern is then focused onto substrate 160, which may be for example a silicon wafer.

Figure 2:
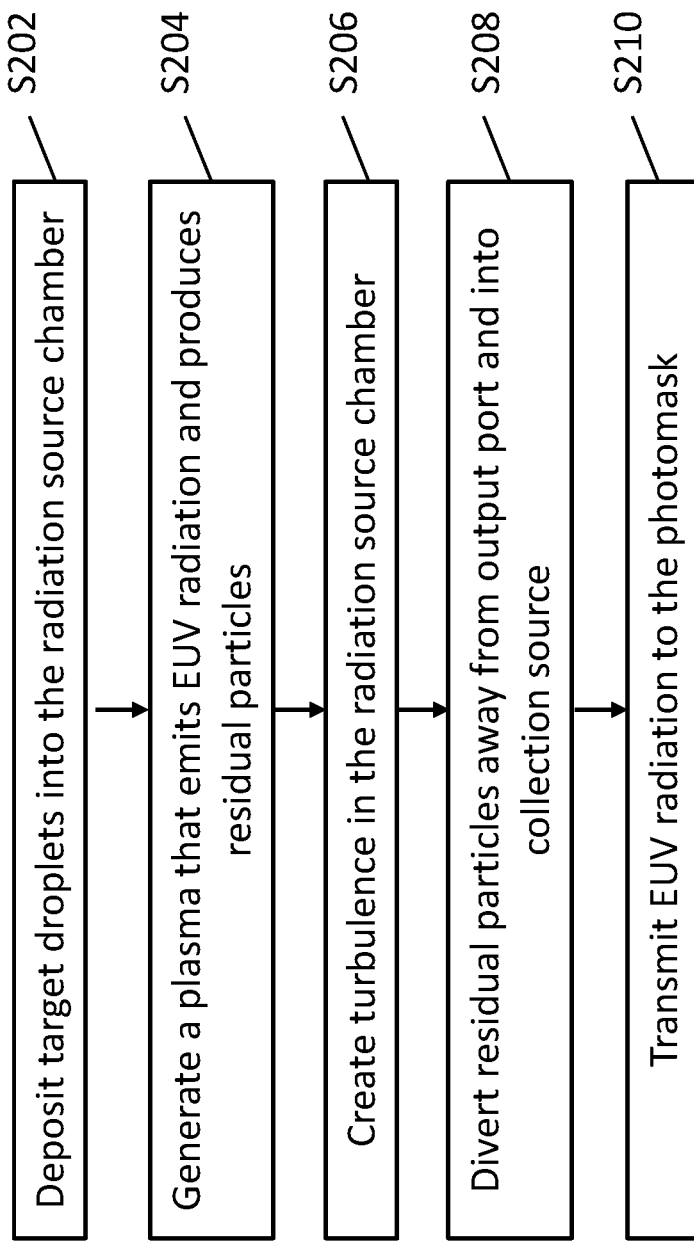
FIG. 2 is a method in accordance with some embodiments.

FIG. 2 illustrates an exemplary method M in accordance with some embodiments, for operating an EUV light source. The method M may be implemented, in whole or in part, by a system for use with extreme ultraviolet (EUV) lithography or other lithography processes requiring light that is generated by ionizing atoms and which results in residual particles or droplets that could potentially be deposited on a mask. Additional operations can be provided before, during, and after the method M, and some operations described can be replaced, eliminated, modified, moved around, or relocated for additional embodiments of the method. One of ordinary skill in the art may recognize other examples of semiconductor fabrication processes that may benefit from aspects of the present disclosure. The method M is an example and is not intended to limit the present disclosure beyond what is explicitly recited in the claims. The method M is described below along with the reference numerals of FIG. 1.

Referring now to FIG. 2, the method M begins at step S202, where a plurality of target droplets 116 is deposited into the radiation source chamber 112 by the target droplet generator. Next, at step S204, a laser contacts the target droplets, thereby generating a plasma 125 that emits EUV radiation in the radiation source chamber. This plasma generation also produces residual debris or particles 101. The residual debris of the EUV radiation may include metal dust, target material vapor and micro-droplets or clusters. The residual debris can be in several forms. For example, tin may be present as pure tin or a tin compound, e.g., $SnBr_4$, $SnH_4$, etc., and/or may include oxides. Dust and other contaminants may also be present in the radiation source chamber. This residual particulate/debris can escape the radiation source chamber via the output port 119 of the EUV light source and into the process chamber 142 containing the photomask 140, where undesired particles can potentially be deposited onto the photomask, for example on its surface, and thus damage the photomask.

Continuing, the method M proceeds to step S206, where turbulence is created in the radiation source chamber by adjusting one or more of several tool parameters to be irregular over time. In some embodiments, the tool parameters may include temperature, pressure, or gas flow rate. In other embodiments, the tool parameters may include other environmental and nonenvironmental parameters as well. The time period of the changing parameters can be regular or irregular over different time periods. The magnitude of the changing parameters can also be regular or irregular. In some embodiments, the changed parameters are a combination of at least two of the tool parameters (temperature, pressure, or gas flow rate).

Altering at least one tool parameter in the radiation source chamber increases turbulence in the radiation source chamber. Without this turbulence in the radiation source chamber, the residual debris in the radiation source chamber could escape the radiation source chamber and end up being deposited on downstream optics, the pellicle, or the photomask, as well as on other surfaces of the radiation source chamber itself. This degradation of the photomask and pellicle results in increased down-time and lower product yield while the mask is repaired. The accumulation of residual debris on the photomask is reduced by the increase in turbulence. As turbulence increases, escape of the residual debris from the radiation source chamber (resulting from generation of EUV radiation) is reduced.

As indicated in step S208 of method M, due to the increased turbulence in the radiation source chamber 112, the residual debris 101 is diverted away from the output port 119, and instead collected into a collection source. In some embodiments, the collection source is a scrubber 174. In other embodiments, the collection source can be some other means for collection of particulates and debris.

Finally, method M proceeds to step S210 where the EUV radiation is transmitted towards the photomask 140. The particulate deposition rate on the photomask, particularly of tin (Sn) particles, is greatly reduced due to the decreased particulate level in the radiation source chamber, which can no longer escape into the process chamber 142 containing the photomask.

In some embodiments, the method M (illustrated in FIG. 2) may be implemented in a computer program product that may be executed on a computer. The computer program product may comprise a non-transitory computer-readable recording medium on which a control program is recorded (stored), such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

Further, the exemplary system and method may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the functions and structures described above (and/or embodied in the flowchart shown in FIG. 2) can be used to implement the methods for reducing particulate deposition rate on a photolithographic mask by producing turbulence within a radiation source chamber.

As discussed above, turbulence in the radiation source chamber is generated by changing one or more of several tool parameters to be irregular over time. In some embodiments, the changed tool parameters may include temperature, pressure, or gas flow rate. As illustrated in FIG. 1, these three parameters may be monitored using sensors, such as thermometer 180, pressure gauge 182, and/or flow meter 184, which feed to controller 190. The tool parameters may be changed by altering their setpoints using the controller.

Turbulence in the radiation source chamber is increased as the environmental parameters are changed over irregular or regular time periods. When changing irregularly, four consecutive time periods at different setpoints are considered. If the four time periods are not the same, then the environmental parameter is being changed at irregular time periods.

If the four time periods are the same, then the environmental parameter is being changed at regular time periods.

FIG. 3A is an example of a temperature versus time graph where the temperature of the radiation source chamber is altered over irregular time periods. As illustrated here, the controller will vary the temperature between relatively high temperature $T_1$ and relatively low temperature $T_2$. Two different time periods are seen here: (1) a high temperature time period during which the temperature is maintained at high temperature $T_1$; and (2) a low temperature time period during which the temperature is maintained at low temperature $T_2$. High temperature time periods are indicated here as $TP_1$ ($t_{1-0}$), $TP_3$ ($t_6-t_2$), and $TP_5$ ($t_5-t_4$). Similarly, low temperature time periods are indicated here as $TP_2$ ($t_2-t_1$), $TP_4$ ($t_4-t_6$), and $TP_6$ ($t_6-t_5$).

As illustrated here, the length of time periods $TP_1$, $TP_2$, $TP_3$, and $TP_4$ are not all the same. Thus, the temperature here is being changed over irregular time periods. This observation would also hold for any other four consecutive time periods illustrated here.

It is also noted that $TP_4$ has a different setpoint from prior period $TP_3$, which has a different setpoint from prior period $TP_2$, which has a different setpoint from prior period $TP_1$. Only consecutive setpoints must be different, the four time periods do not have to have completely different setpoints.

FIG. 3B is an example of a temperature versus time graph where the temperature of the radiation source chamber is altered over regular time periods. As illustrated here, the length of time periods $TP_1$, $TP_2$, $TP_3$, and $TP_4$ are all the same. Thus, the temperature here is being changed over irregular time periods.

It is noted that it is possible for three time periods to be the same, but if the fourth time period is different, then the environmental parameter is still being changed over irregular time periods. Thus, it is contemplated that most of the time, the environmental parameter(s) is being changed over irregular time periods.

The direction in which the environmental parameter is changed is not particularly significant. In a first embodiment, the change in an environmental parameter moves between a relatively low setpoint and a relatively a relatively high setpoint over regular time periods. In a second embodiment, the change in an environmental parameter will transition between a relatively high setpoint and a relatively low setpoint over regular time periods. In a third embodiment, the change in an environmental parameter transitions between a relatively low setpoint and a relatively high setpoint over irregular time periods. In a fourth embodiment, the change in an environmental parameter transitions between a relatively high setpoint and a relatively low setpoint over irregular time periods. It is contemplated that varying between two setpoints, a relatively high setpoint and a relatively low setpoint, will be sufficient to create turbulence. However, varying between more than two setpoints (e.g. three or four setpoints) is contemplated as well in accordance with some embodiments.

In embodiments where the temperature is varied, the temperature of the radiation source chamber can be as low as −20° C. and as high as 600° C. However, generally speaking, if one temperature setpoint is below the melting point of tin (~231° C.), then the other temperature setpoint should be above the melting point of tin. It is also noted that the temperature can be changed between setpoints relatively quickly. For example, it may take only 10 minutes to change the temperature from 50° C. to 500° C. In some embodiments, the difference between first and second temperature setpoints is at least 50° C., or at least 100° C. The difference between the first and second setpoints may be at most 200° C.

In a first embodiment, the high temperature setpoint $T_1$ can be from about 200° C. to about 600° C., and the low temperature setpoint $T_2$ can be from about 10° C. to about −20° C.

In a second embodiment, the high temperature setpoint $T_1$ can be from about 350° C. to about 600° C., and the low temperature setpoint $T_2$ can be from about 230° C. to about 300° C. It is noted that both setpoints are close to or above the melting point of tin.

In a third embodiment, the high temperature setpoint $T_1$ can be from about 250° C. to about 500° C., and the low temperature setpoint $T_2$ can be from about 50° C. to about 200° C.

In a fourth embodiment, the difference between the high temperature setpoint $T_1$ and the low temperature setpoint $T_2$ is at least 50° C., and both temperature setpoints are above 230° C.

The temperature can be changed between first and second setpoints such that each time period ranges from about 1 hour to about 96 hours (4 days). In more particular embodiments, each time period ranges from about 4 hours to about 72 hours, or from about 24 hours to about 96 hours, or from about 24 hours to about 48 hours (about 1 day to about 2 days), or from about 48 hours to about 72 hours (about 2 days to about 3 days). For purposes of monitoring the temperature, the temperature of the radiation source chamber can be measured at the vanes (it is recognized that, for example, the temperature of the chamber may be very different where the plasma is located). Referring to FIG. 1, the temperature of the radiation source chamber can be changed, for example, by flowing liquid/gas of different temperature through the vanes or by cooling any gases entering the chamber (for example through gas ports). In some embodiments, only the temperature is changed to create turbulence, while the pressure and gas flow rate are maintained.

With respect to pressure, as previously noted, the radiation source chamber in the EUV light source is typically maintained at vacuum or a low pressure (e.g. 0.001 Pa) to reduce EUV absorption by gas molecules. However, it is believed the pressure in the radiation source chamber could potentially be as high as 101 kPa (i.e. 1 atmosphere) and still obtain the desired EUV output.

Thus, when the pressure is varied, the pressure of the radiation source chamber may be as low as 0 pascals (Pa) and as high as 101 kPa. The pressure can be changed between setpoints relatively quickly. For example, it may take only 30 minutes to change the pressure between two setpoints. In some embodiments, the difference between first and second pressure setpoints is at least 10 pascals (Pa), or at least 20 Pa, or at least 50 Pa. The difference between the setpoints may be at most 500 Pa, or at most 200 Pa, or at most 100 Pa.

In a first embodiment, the high pressure setpoint $P_1$ can be from about 50 Pa to about 50,000 Pa, and the low pressure setpoint $P_2$ can be from about 0 Pa to about 10 Pa.

In a second embodiment, the high pressure setpoint $P_1$ can be from about 100 Pa to about 1000 Pa, and the low pressure setpoint $P_2$ can be from about 0 Pa to about 10 Pa.

In a third embodiment, the high pressure setpoint $P_1$ can be from about 50 Pa to about 100 Pa, and the low pressure setpoint $P_2$ can be from about 0 Pa to about 10 Pa.

In a fourth embodiment, the difference between the high pressure setpoint $P_1$ and the low pressure setpoint $P_2$ is at least 10 Pa, and both pressure setpoints are above 0 Pa.

The pressure can be changed between first and second setpoints such that each time period ranges from about 1 hour to about 96 hours (4 days). In more particular embodiments, each time period ranges from about 4 hours to about 72 hours, or from about 24 hours to about 96 hours, or from about 24 hours to about 48 hours (about 1 day to about 2 days), or from about 48 hours to about 72 hours (about 2 days to about 3 days). Referring to FIG. 1, the pressure of the radiation source chamber can be changed, for example, by changing the pump rate of vacuum pump or by adding a gas into the chamber. In some embodiments, only the pressure is changed to create turbulence, while the temperature and gas flow rate are maintained.

With respect to gas flow rate, as previously noted, some gases are provided into the radiation source chamber. For example, gases such as hydrogen gas (e.g., $H_2$), He, Ar, $N_2$, or other inert gases are provided to serve as buffers, for example to reduce particulate buildup on the collector mirror, or for particulate capture/control or for other purposes. A buffer gas, such as hydrogen gas, normally flows into the radiation source chamber at a rate of 1 standard liter per minute (slm). Extra dry clean air normally flows into the radiation source chamber at a rate of ~10 slm.

When the gas flow rate is varied, only the flow of a particular gas (i.e. the target gas) is considered. The gas flow rate can be changed between setpoints quickly. For example, it may take only 10 minutes to change the gas flow rate between two setpoints. In some embodiments, the difference between first and second gas flow rate setpoints is at least 0.5 slm, or at least 1 slm. The difference between the setpoints may be at most 0.8 slm, or at most 1.0 slm, or at most 2 slm.

In a first embodiment, the high gas flow rate setpoint $F_1$ for hydrogen can be from about 0.5 slm to about 1 slm, and the low gas flow rate setpoint $F_2$ for hydrogen can be from about 0.1 slm to about 0.5 slm. The setpoint $F_1$ is greater than the setpoint $F_2$.

In a second embodiment, the difference between the high gas flow rate setpoint $F_1$ for hydrogen and the low gas flow rate setpoint $F_2$ for hydrogen is at least 0.5 slm, and both gas flow rate setpoints are above 0.1 slm.

In a third embodiment, the high gas flow rate setpoint $F_1$ for extra dry clean air (EDCA) can be from about 5 slm to about 10 slm, and the low gas flow rate setpoint $F_2$ for EDCA can be from about 0.1 slm to about 5 slm. The setpoint $F_1$ is greater than the setpoint $F_2$.

In a fourth embodiment, the high gas flow rate setpoint $F_1$ for EDCA can be from about 8 slm to about 10 slm, and the low gas flow rate setpoint $F_2$ for EDCA can be from about 0 slm to about 6 slm.

In a fifth embodiment, the difference between the high gas flow rate setpoint $F_1$ for EDCA and the low gas flow rate setpoint $F_2$ for EDCA is at least 0.5 slm, and both gas flow rate setpoints are above 0 slm.

The gas flow rate can be changed between first and second setpoints such that each time period ranges from about 1 hour to about 96 hours (4 days). In more particular embodiments, each time period ranges from about 4 hours to about 72 hours, or from about 24 hours to about 96 hours, or from about 24 hours to about 48 hours (about 1 day to about 2 days), or from about 48 hours to about 72 hours (about 2 days to about 3 days). Referring to FIG. 1, the gas flow rate of the radiation source chamber can be changed, for example, by changing the flow rate through gas ports. In some embodiments, only the gas flow rate is changed to create turbulence, while the temperature and pressure are maintained.

Figure 3C:
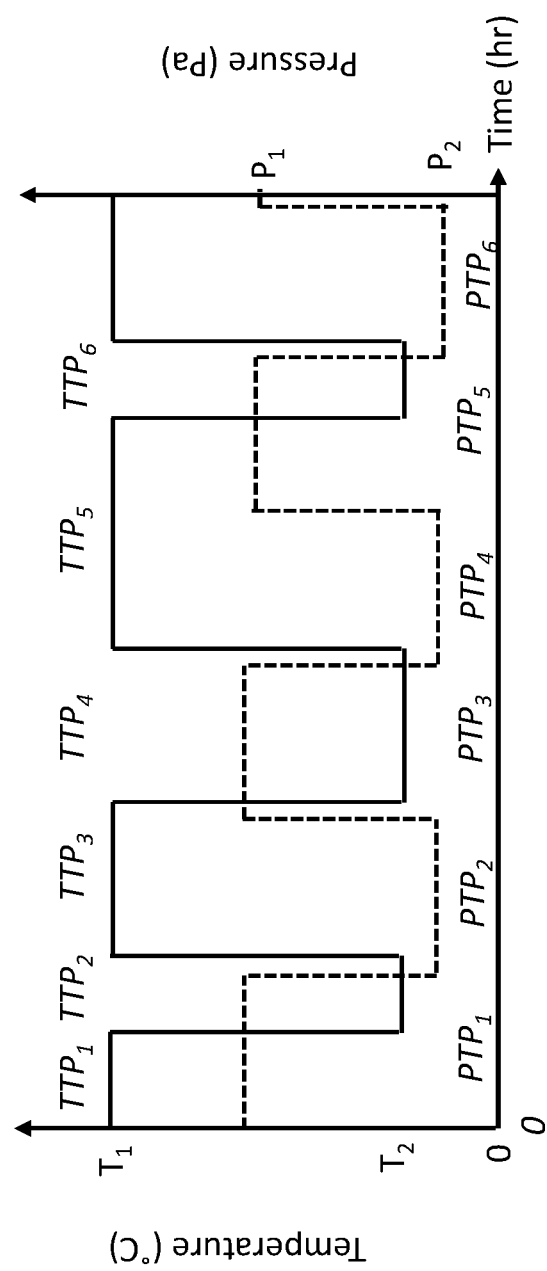
FIG. 3C is an illustrative graph showing two environmental parameters being independently changed in both their time period and magnitude of change, in accordance with some embodiments.

In another exemplary embodiment, two environmental parameters are altered to generate turbulence in the radiation source chamber. For example, the temperature and the pressure, or the temperature and the gas flow rate, or the pressure and the gas flow rate can be altered. These parameters can be changed as described above. It is noted that the two parameters do not have to be changed at the same time, or for the same time periods, though that might be more convenient. For example, FIG. 3C illustrates a system where the temperature and the pressure of the radiation source chamber are altered to generate turbulence. As illustrated here, the length of temperature time periods $TTP_1$, $TTP_2$, $TTP_3$, $TTP_4$, $TTP_5$, and $TTP_6$ are different, or in other words the temperature is changing over irregular time periods. In contrast the length of pressure time periods $PTP_1$, $PTP_2$, $PTP_3$, $PTP_4$, $PTP_5$, and $PTP_6$ are the same, so that the pressure is changing over regular time periods. In addition, the times at which the temperature or pressure is changing differ from each other.

In another exemplary embodiment, the temperature, the pressure, and the gas flow rate are all altered to generate turbulence in the radiation source chamber. Again, these parameters can be changed as described above, and they do not have to be changed at the same time, or for the same time periods, though that might be more convenient.

Referring back to FIG. 1, the environmental parameters can be changed by a controller operating a computer program which alters the setpoints. For example, controller 190 is shown as being able to alter the temperature of vanes 172, or the pump rate of vacuum pump 186, or the gas flow rate through gas ports 170. The controller can randomly vary the time periods and the magnitudes of the setpoints within specified ranges, or can follow a set schedule for changing the setpoints of a given environmental parameter. The controller may include a user interface for communicating with operators.

The turbulence created by repeatedly changing the environmental parameters creates additional air flow patterns which cause particulates, such as tin particles, to be diverted away from the output port and, for example, causes the particulates to be diverted to a particle trap, such as air scrubber. As a result, such particulates are not able to escape from the EUV light source into the processing chamber where the particulates might land on the photomask. It is believed that the methods of the present disclosure can reduce the number of tin particles being deposited on the photomask by up to 50%.

Figure 4:
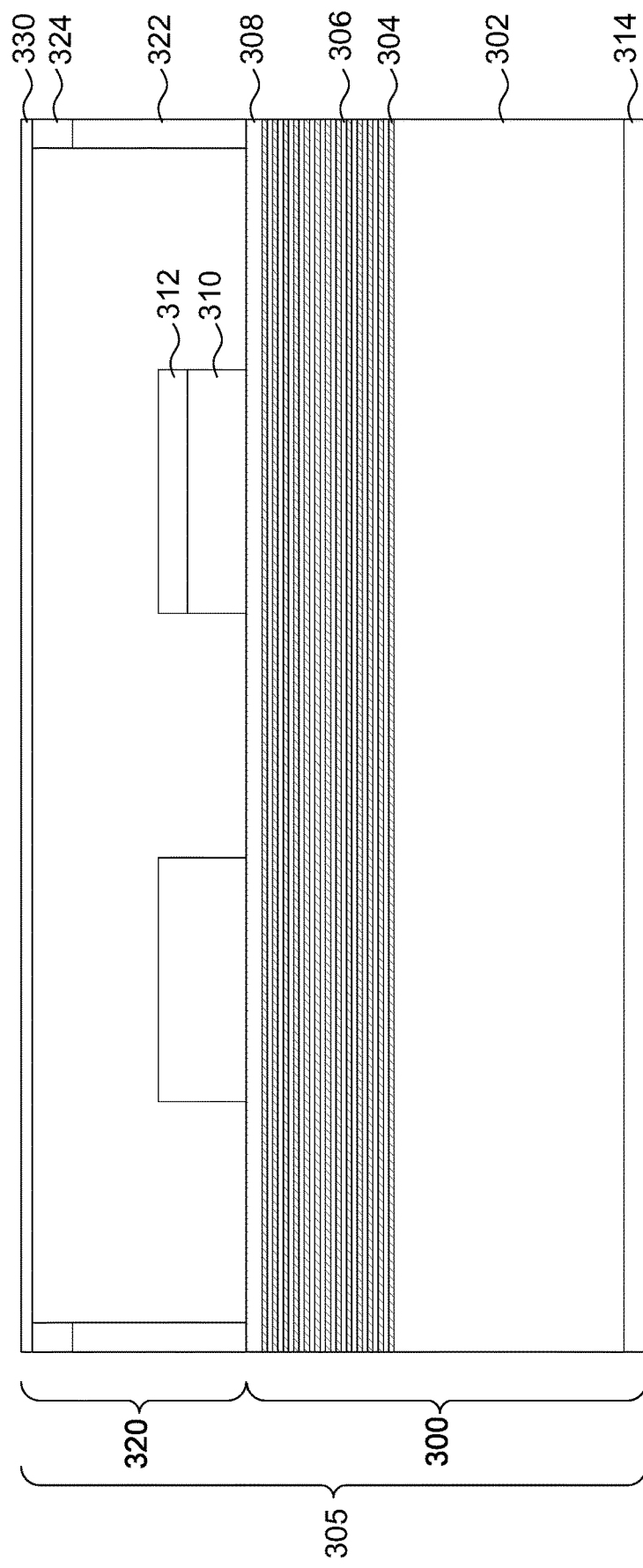
FIG. 4 is a cross-sectional view of an example mask and pellicle assembly, which is protected by use of the methods of the present disclosure, in accordance with some embodiments.

FIG. 4 illustrates a cross-sectional view of an exemplary mask assembly 305 useful in lithography, according to some embodiments, which is protected by the methods of the present disclosure. The mask assembly 305 includes a mask 300 and a pellicle assembly 320. The illustrative mask 300 (also referred to in the art as a mask, photomask, or similar phraseology) is a reflective mask of a type commonly used in EUV lithography, and includes a substrate 302, alternating reflective layers 304 and spacing layers 306, a capping layer 308, an EUV absorbing layer 310 that is patterned to define a mask pattern, an anti-reflective coating (ARC) 312, and a conductive backside layer 314. The illustrative mask 300 is merely a nonlimiting example. More generally, pellicles, as disclosed herein, can be used with substantially any type of reflective or transmission mask. As another example (not shown), the mask may be a transmission mask, in which case the substrate is transmissive for light at the wavelength at which the lithography is performed. In general, the reflective or transmissive mask includes a substrate (e.g., substrate 302) and a mask pattern (e.g., absorbing layer 310) disposed on the substrate. The pellicle assembly 320 includes a mounting frame 322, an adhesive layer 324, and a pellicle membrane 330. In some non-limiting illustrative embodiments, the mask and pellicle assembly are intended for use with EUV light wavelengths, for example from 124 nm to 10 nm, including about 13.5 nm.

In embodiments, the substrate 302 is made from a low thermal expansion material (LTEM), such as quartz or titania silicate glasses available from Corning under the trademark ULE. This reduces or prevents warping of the mask due to absorption of energy and consequent heating. The reflective layers 304 and the spacing layers 306 cooperate to form a Bragg reflector for reflecting EUV light. In some embodiments, the reflective layers may comprise molybdenum (Mo). In some embodiments, the spacing layers may comprise silicon (Si). The capping layer 308 is used to protect the reflector formed from the reflective layers and the spacing layers, for example from oxidation. In some embodiments, the capping layer comprises ruthenium (Ru). The EUV absorbing layer 310 absorbs EUV wavelengths and is patterned with the desired pattern. In some embodiments, the EUV absorbing layer comprises tantalum boron nitride. The anti-reflective coating (ARC) 312 further reduces reflection from the EUV absorbing layer. In some embodiments, the anti-reflective coating comprises oxidized tantalum boron nitride. The conductive backside layer 314 permits mounting of the illustrative mask on an electrostatic chuck and temperature regulation of the mounted substrate 302. In some embodiments, the conductive backside layer comprises chrome nitride.

The mounting frame 322 supports the pellicle membrane at a height sufficient to take the pellicle membrane 330 outside the focal plane of the lithography, e.g., several millimeters (mm) over the mask in some nonlimiting illustrative embodiments. The mounting frame itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane.

The adhesive layer 324 is used to secure the pellicle membrane to the mounting frame. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system, to prevent the adhesive from exceeding the Tg during operation of the system.

The systems and methods of the present disclosure attain the advantage of greatly reducing deposition of particulates, especially tin particles, on the photomask. Reduced particulate deposition on the mask increases the production and yield capacity of the overall lithography system by reducing the need for downtime and repair during the production process.

Another advantage of the present disclosure is that the methods reduce the need to use a pellicle due to reduced particulate levels. This may increase the EUV light dosage available for processing steps downstream of the photomask.

Another advantage of the present disclosure is that the lower particulate levels may increase the longevity of the pellicle, if a pellicle is used on the photomask.

Another advantage of the present disclosure is that the turbulence reduces the deposition of particulates in the radiation source chamber, which increases EUV productivity by increasing uptime due to reduced need to clean the interior of the radiation source chamber itself.

Some embodiments of the present disclosure thus relate to a method for reducing particulate deposition rate on a photomask. Turbulence is produced within a radiation source chamber. The turbulence reduces a level of particulates exiting the radiation source chamber and entering a processing chamber containing the photomask.

Other embodiments of the present disclosure relate to an EUV light source having means for changing at least one of the pressure, temperature, or gas flow rate in a radiation source chamber thereof. A controller is used to change one or more of these parameters at regular or irregular time periods.

Other embodiments of the present disclosure relate to a method for generating turbulence in a radiation source chamber of an EUV light source by changing at least one of the pressure, temperature, or gas flow rate in the radiation source chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for generating turbulence in a radiation source chamber of an EUV light source, comprising:
   changing at least one of the temperature, pressure, or gas flow rate in the radiation source chamber between a first setpoint and a second setpoint;
   wherein a first temperature setpoint and a second temperature setpoint differ by at least 50° C.; or
   wherein a first pressure setpoint and a second pressure setpoint differ by at least 10 pascals; or
   wherein a first gas flow rate setpoint and a second gas flow rate setpoint differ by at least 0.5 slm.

2. The method of claim 1, wherein the first temperature setpoint and the second temperature setpoint are both above 230° C.

3. The method of claim 1, wherein the first temperature setpoint is from about 200° C. to about 600° C., and the second temperature setpoint is from about 10° C. to about −20° C.

4. The method of claim 1, wherein the first pressure setpoint is from about 100 Pa to about 1,000 Pa, and the second pressure setpoint is from about 0 Pa to about 10 Pa.

5. The method of claim 1, wherein the first pressure setpoint is from about 50 Pa to about 100 Pa, and the second pressure setpoint is from about 0 Pa to about 10 Pa.

6. The method of claim 1, wherein gas flow rate of a target gas is changed, and the target gas is hydrogen gas or extra dry clean air.

7. The method of claim 1, wherein the first gas flow rate setpoint is from about 0.5 slm to about 1 slm, the second gas flow rate setpoint is from about 0.1 slm to about 0.5 slm, and a gas flow rate of hydrogen gas is changed.

8. The method of claim 1, wherein the first gas flow rate setpoint is from about 5 slm to about 10 slm, the second gas flow rate setpoint is from about 0.1 slm to about 5 slm, and a gas flow rate of extra dry clean air is changed.

9. The method of claim 1, wherein the temperature, pressure, or gas flow rate is changed over irregular time periods that independently range from about 24 hours to about 96 hours.

10. A method for generating turbulence in a radiation source chamber of an EUV light source, comprising:
changing at least one of the temperature, pressure, or gas flow rate in the radiation source chamber between a first setpoint and a second setpoint to generate the turbulence,
wherein the first setpoint and the second setpoint differ by at least 50° C., or at least 10 pascals, or at least 0.5 slm.

11. The method of claim 10, wherein the temperature, pressure, or gas flow rate is changed over irregular time periods that independently range from about 24 hours to about 96 hours.

12. A method for generating turbulence in a radiation source chamber of an EUV light source, comprising:
changing at least one of the temperature, pressure, or gas flow rate in the radiation source chamber over irregular time periods to generate the turbulence;
wherein the temperature is changed by at least 50° C., the pressure is changed by at least 10 pascals, or the gas flow rate is changed by at least 0.5 slm.

13. The method of claim 12, wherein the irregular time periods independently range from about 24 hours to about 96 hours.

14. The method of claim 10, wherein a first temperature setpoint and a second temperature setpoint differ by at least 50° C.

15. The method of claim 10, wherein a first pressure setpoint and a second pressure setpoint differ by at least 10 pascals.

16. The method of claim 10, wherein a first gas flow rate setpoint and a second gas flow rate setpoint differ by at least 0.5 slm.

17. The method of claim 12, wherein a first temperature setpoint and a second temperature setpoint differ by at least 50° C.

18. The method of claim 12, wherein a first pressure setpoint and a second pressure setpoint differ by at least 10 pascals.

19. The method of claim 12, wherein a first gas flow rate setpoint and a second gas flow rate setpoint differ by at least 0.5 slm.

20. The method of claim 10, wherein a gas flow rate of a target gas is changed, and the target gas is hydrogen gas or extra dry clean air.

* * * * *